United States Patent
Suganuma et al.

(10) Patent No.: US 9,236,162 B2
(45) Date of Patent: Jan. 12, 2016

(54) TRANSPARENT CONDUCTIVE INK AND TRANSPARENT CONDUCTIVE PATTERN FORMING METHOD

(71) Applicants: OSAKA UNIVERSITY, Suita-shi, Osaka (JP); SHOWA DENKO K. K., Minato-ku, Tokyo (JP)

(72) Inventors: Katsuaki Suganuma, Suita (JP); Kuniaki Ohtsuka, Osaka (JP); Koichiro Murahashi, Osaka (JP); Yasutaka Takemura, Osaka (JP); Hiroshi Uchida, Minato-ku (JP)

(73) Assignees: OSAKA UNIVERSITY, Osaka (JP); SHOWA DENKO K.K., Tokyo (JP)

( * ) Notice: Subject to any disclaimer, the term of this patent is extended or adjusted under 35 U.S.C. 154(b) by 0 days.

(21) Appl. No.: 14/396,853
(22) PCT Filed: Apr. 26, 2013
(86) PCT No.: PCT/JP2013/062387
§ 371 (c)(1),
(2) Date: Oct. 24, 2014
(87) PCT Pub. No.: WO2013/161996
PCT Pub. Date: Oct. 31, 2013

(65) Prior Publication Data
US 2015/0056382 A1 Feb. 26, 2015

(30) Foreign Application Priority Data
Apr. 26, 2012 (JP) ................................ 2012-101049

(51) Int. Cl.
*C09D 11/52* (2014.01)
*C09D 11/03* (2014.01)
(Continued)

(52) U.S. Cl.
CPC *H01B 1/22* (2013.01); *C09D 11/03* (2013.01); *C09D 11/52* (2013.01); *H01B 13/003* (2013.01);
(Continued)

(58) Field of Classification Search
CPC .......... C09D 11/52; C09D 11/03; H01B 1/22; H01B 13/003; H05K 1/097; H05K 2201/0108; H05K 3/1283; H05K 2203/107

USPC ......... 106/31.92; 252/512, 514; 427/551, 553
See application file for complete search history.

(56) References Cited

U.S. PATENT DOCUMENTS

| 2004/0152832 A1 | 8/2004 | Kirchmeyer et al. |
| 2004/0191690 A1 | 9/2004 | Hayakawa |

(Continued)

FOREIGN PATENT DOCUMENTS

| EP | 2 824 676 A1 | 1/2015 |
| JP | 06-139814 A | 5/1994 |

(Continued)

OTHER PUBLICATIONS

Second Office Action dated Nov. 25, 2014 from the Japanese Patent Office in counterpart Japanese Patent Application No. 2014-512709.

(Continued)

*Primary Examiner* — Helene Klemanski
(74) *Attorney, Agent, or Firm* — Sughrue Mion, PLLC

(57) ABSTRACT

Provided is a transparent conductive ink which contains metal nanowires and/or metal nanotubes as a conductive component and can form a coating film which has good conductivity and a high light transmittance property, and also provided is a transparent conductive pattern forming method wherein this transparent conductive ink is used for forming a transparent conductive pattern by simple production steps, to thereby suppress the production cost and environmental load. At least one of metal nanowires and metal nanotubes are dispersed in a dispersion medium containing a shape-holding material which contains an organic compound having a molecular weight in the range of 150 to 500 and which has a viscosity of $1.0 \times 10^3$ to $2.0 \times 10^6$ mPa·s at 25° C., to prepare a transparent conductive ink. A transparent conductive pattern is formed by printing a pattern having an arbitrary shape on a substrate using this transparent conductive ink, subjecting the pattern to a heating treatment to dry the pattern, and subjecting the pattern which has been dried to pulsed light irradiation.

10 Claims, 3 Drawing Sheets

(51) Int. Cl.
  *H01B 1/22* (2006.01)
  *H01B 13/00* (2006.01)
  *H05K 1/09* (2006.01)
  *H05K 3/12* (2006.01)

(52) U.S. Cl.
  CPC ........ *H01B 13/0016* (2013.01); *H01B 13/0036* (2013.01); *H05K 1/097* (2013.01); *H05K 3/1283* (2013.01); *H05K 2201/0108* (2013.01); *H05K 2203/107* (2013.01)

(56) References Cited

U.S. PATENT DOCUMENTS

| | | | |
|---|---|---|---|
| 2006/0202174 A1 | 9/2006 | Barker et al. | |
| 2007/0074316 A1 | 3/2007 | Alden et al. | |
| 2008/0259262 A1* | 10/2008 | Jones | B82Y 10/00 349/139 |
| 2008/0283799 A1 | 11/2008 | Alden et al. | |
| 2010/0285233 A1 | 11/2010 | Brasseur et al. | |
| 2011/0192457 A1 | 8/2011 | Nakayama et al. | |
| 2014/0308460 A1* | 10/2014 | Uchida | H05K 3/105 427/557 |
| 2014/0332734 A1* | 11/2014 | Uchida | H01B 1/22 252/514 |
| 2015/0024120 A1* | 1/2015 | Uchida | C09D 11/52 252/512 |
| 2015/0030783 A1* | 1/2015 | Suganuma | H01B 13/003 427/553 |
| 2015/0103269 A1* | 4/2015 | Suganuma | H05K 1/097 349/12 |

FOREIGN PATENT DOCUMENTS

| | | |
|---|---|---|
| JP | 2003-100147 A | 4/2003 |
| JP | 2004-247300 A | 9/2004 |
| JP | 2006-321976 A | 11/2006 |
| JP | 4077675 B2 | 4/2008 |
| JP | 2009-505358 A | 2/2009 |
| JP | 2009-140788 A | 6/2009 |
| JP | 2010-73322 A | 4/2010 |
| JP | 2010-165900 A | 7/2010 |
| JP | 2010-525526 A | 7/2010 |
| JP | 2010-257958 A | 11/2010 |
| JP | 2010-287540 A | 12/2010 |
| JP | 2011-060752 A | 3/2011 |
| JP | 2011-070968 A | 4/2011 |
| JP | 2011-511457 A | 4/2011 |
| JP | 2011-159670 A | 8/2011 |
| JP | 2012-009383 A | 1/2012 |
| JP | 2012-023088 A | 2/2012 |
| WO | 2007/022226 A3 | 2/2007 |
| WO | 2007022226 A2 | 2/2007 |
| WO | 2008/131304 A1 | 10/2008 |
| WO | 2010/016186 A1 | 2/2010 |

OTHER PUBLICATIONS

Communication dated May 20, 2015 from the Korean Intellectual Property Office in counterpart application No. 10-2014-7029936.
International Search Report of PCT/JP2013/062387 dated Sep. 24, 2013.
English Translation for JP 2011-159670 (of record), Aug. 2011.
English Translation for JP 2009-140788 (of record), Jun. 2009.
English Translation for JP 2012-023088 (of record), Feb. 2012.
English Translation for JP 2011-060752 (of record), Mar. 2011.
English Translation for JP 2010-257958 (of record), Nov. 2010.
English Translation for JP H06-139814 (of record), May 1994.
Communication dated Aug. 5, 2014 from Japanese Patent Office in counterpart Japanese Patent Application No. 2014512709.
International Preliminary Report on Patentability dated Oct. 28, 2014 from the International Bureau of WIPO in counterpart International Patent Application No. PCT/JP2013/062387.
European Search Report issued in corresponding EP Application No. 13782608.7 dated Sep. 21, 2015.

* cited by examiner

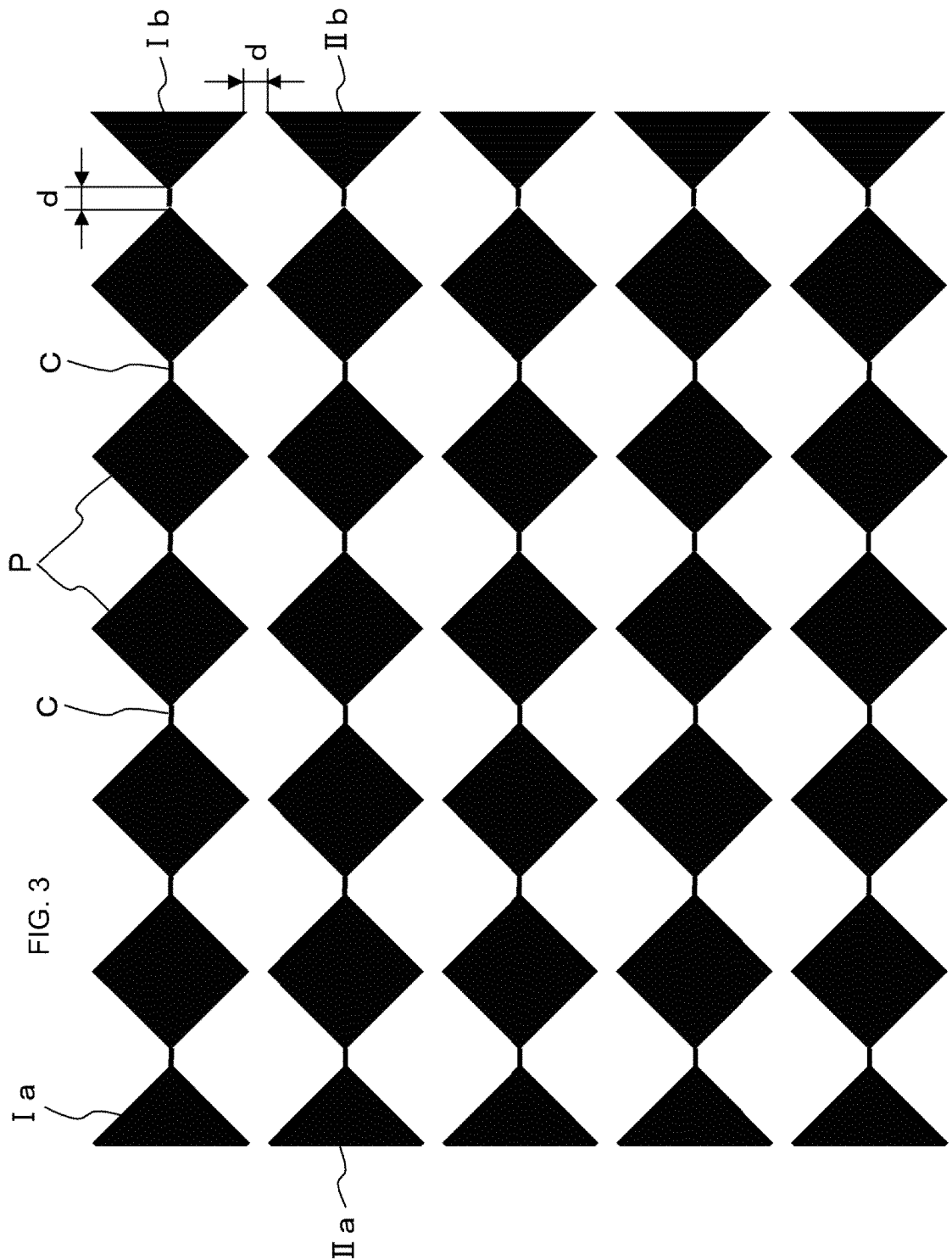

TRANSPARENT CONDUCTIVE INK AND TRANSPARENT CONDUCTIVE PATTERN FORMING METHOD

TECHNICAL FIELD

The present disclosure relates a transparent conductive ink and a transparent conductive pattern forming method.

BACKGROUND ART

A transparent conductive film is used in various fields such as a liquid crystal display (LCD), a plasma display panel (PDP), an organic electroluminescence (OLED), a transparent electrode for a photovoltaic cell (PV) and a touch panel (TP), an electro-static discharge (ESD) film, and an electro-magnetic interference (EMI) film, etc. For the transparent conductive film, (1) low surface resistance, (2) high light transmittance, and (3) high reliability, are required.

For example, a transparent electrode for an LCD has a surface resistance within a range of 10 to 300Ω/□, and a light transmittance in the visible light range of 85% or more. More preferably, the surface resistance is within the range of 20 to 100Ω/□, and the light transmittance is 90% or more. A transparent electrode for an OLED has a surface resistance within a range of 10 to 100Ω/□, and alight transmittance in the visible light range of 80% or more. More preferably, the surface resistance is within the range of 10 to 50Ω/□, and the light transmittance is 85% or more. A transparent electrode for a PV has a surface resistance of within a range of 5 to 100Ω/□, and a light transmittance in the visible light range of 65% or more. More preferably, the surface resistance is within the range of 5 to 20Ω/□, and the light transmittance of 70% or more. An electrode for a TP has a surface resistance within a range of 100 to 1000Ω/□, and alight transmittance in the visible light range of 85% or more. More preferably, the surface resistance is within the range of 150 to 500Ω/□, and the light transmittance in the visible light range is 90% or more. An ESD film has a surface resistance within a range of 500 to 10000Ω/□, and a light transmittance in the visible light range of 90% or more. More preferably, the surface resistance is within the range of 1000 to 5000Ω/□, and the light transmittance in the visible light range is 95% or more.

Conventionally, ITO (Indium Tin Oxide) has been used for transparent conductive films used for such transparent electrodes. However, indium used for ITO is a rare metal, and recently, stabilizing the supply and the price of indium has become an issue. Also, for the formation of ITO films, a sputtering method, a vapor-deposition method, and the like requiring high vacuum are used, and thus, a vacuum production apparatus is required and the production takes a long time, resulting in the higher cost. Further, a crack may be easily generated in ITO due to a physical stress such as bending and ITO can be easily broken. Therefore, applying ITO to a flexible substrate is difficult. Accordingly, alternative materials for ITO capable of overcoming these drawbacks have been searched for.

Among "alternative materials for ITO", as materials which do not require the use of a vacuum production apparatus, and which can be used for forming films by coating, conductive materials, for example, (i) polymer-based conductive materials such as poly(3,4-ethylenedioxythiophene)/poly(4-styrenesulfonic acid) (PEDOT: PSS) (for example, refer to Patent Document 1), conductive materials containing a nanostructured conductive component such as (ii) metal nanowires (for example, refer to Patent Document 2 and Non-patent Document 1), and (iii) carbon nanotubes (for example, refer to Patent Document 3), have been reported.

Among these, (ii) conductive materials containing metal nanowires are reported to have a low surface resistance and a high light transmittance (for example, refer to Patent Document 2 and Non-patent Document 1), and further, have flexibility, and thus, are suitable as "alternative materials for ITO".

Here, pattern formation of a transparent conductive film is required corresponding to the purpose of use, in order that the transparent conductive film is used as a transparent electrode. For the pattern formation of ITO, a photolithography using a resist material has been generally used.

As a method for forming a conductive material containing metal nanowires, Non-patent Document 1 describes the following steps.

(1) Step for coating a conductive ink containing metal nanowires on a substrate
(2) Step for forming a transparent conductive layer by sintering
(3) Step for forming a photosensitive resist on the transparent conductive layer
(4) Step for applying photoenergy to the resist through an appropriate light shielding mask corresponding to a fine pattern
(5) Step for developing the obtained latent image of the resist with an appropriate development solution
(6) Step for removing the exposed patterned film (transparent conductive layer) by an appropriate etching method
(7) Step for removing a remaining resist using an appropriate method In practice, in addition to the above steps, appropriate substrate surface treatment, washing, and drying steps, etc., may be required.

Patent Document 2 describes the following steps.
(1) Step for coating a conductive ink containing silver nanowires dispersed in water, on a substrate
(2) Step for forming a silver nanowire network layer by sintering
(3) Step for depositing a photo-curable matrix material containing a prepolymer on the silver nanowire network layer
(4) Step for applying photoenergy to the matrix material through a light shielding mask corresponding to a fine pattern
(5) Step for removing uncured regions by washing with a solvent (ethanol), or step for physically removing the uncured regions using an adhesive tape or a tacky roller.

Patent Document 4 describes the following steps.
(1) Step for coating a conductive ink containing silver nanowires dispersed in a solution containing a photopolymer, on a substrate
(2) Step for applying photoenergy to the photopolymer through an appropriate light shielding mask corresponding to a fine pattern
(3) Step for developing uncured regions with a developing solution.

Patent Document 5 describes the following steps.
(1) Step for coating a resin solution containing metal nanofillers on a surface of a transparent base material
(2) Step for arranging a mask having a patterned opening, on the surface of the transparent conductive film
(3) Step for performing a plasma treatment or a corona treatment through the mask on the side opposite to the side of the transparent conductive film, for forced oxidization of the metal nanofillers in the transparent conductive film at the portion corresponding to the opening of the mask, and forming a non-conductive portion with the oxidized metal nanofillers and forming a conductive portion with the unoxidized metal nanofillers.

However, in either of the methods disclosed in Non-patent Document 1 and Patent Document 2, a step for further forming a photosensitive layer for pattern formation, on the layer containing the metal nanowires, is necessary. Further, a step for developing the photosensitive layer, and a step for removing the exposed metal-nanowire containing layer, are necessary. Thus, the silver nanowires at the portion to be removed are wasted, waste disposal of the developer may be required. In addition, after the development of the photosensitive layer and the removal of the exposed metal-nanowire containing layer, a step for removing the photosensitive layer may be required.

The method disclosed in Patent Document 4 also requires a development step, and thus, the silver nanowires may be wasted by the development, and a problem regarding the waste disposal of the developer may occur.

Accordingly, in order to obtain a transparent conductive film, there are drawbacks that a large number of steps are required, the production cost is high, problems regarding the waste liquid disposed in each step occur, and each step is not optimized and thus, changes in electric properties and optical properties before and after each step are accumulated.

The method disclosed in Patent Document 5 also has drawbacks that complete insulation of silver nanowires by the plasma treatment or the corona treatment is very difficult, and the base material is deteriorated by the plasma treatment or the corona treatment, resulting in decreasing the transparency and the durability.

Although no example regarding the silver nanowire is disclosed, Patent Document 6 discloses a following method as a method for printing a conductive ink on a substrate to form a patterned conductive layer.

(1) Forming a pattern on a substrate by printing, using a liquid repellent transparent insulation ink which contains a resin and a silicone-based or fluorine-based surfactant, and
(2) Coating a conductive ink which is repellent against a dry film of the liquid repellent transparent insulation ink, on the entirety of the dry film, and as the conductive ink is repelled by the dry film of the liquid repellent transparent insulation ink, a conductive ink layer is formed on a portion of the substrate where the dry film of the liquid repellent transparent insulation ink is not formed.

According to this method, both a repellent transparent ink and a hydrophilic conductive ink should be designed, and thus, the blending system becomes complicated, and the pattern accuracy largely depends on not only the printing accuracy, but also the repellencies between the repellent-hydrophilic resins. Therefore, improving the pattern accuracy is difficult.

Accordingly, it has been desired to directly forming a pattern by applying silver nanowires by a printing method such as inkjet printing, screen printing, gravure printing, and flexographic printing. However, in order to perform printing, a binder resin is necessary, and in order to maintain the transparent property, the amount of silver nanowires used should be reduced, which leads to drawbacks that the binder resin covers the surfaces of the silver nanowires and the conductivity is lost. When no binder resin is used, there are drawbacks that the pattern cannot be maintained at the printing, or even if the pattern can be maintained immediately after printing, the pattern is broken when the solution is dried.

Therefore, in Patent Document 7, an organic conductive polymer is used as a binder resin, and a pattern (transparent electrode) is formed according to the following steps.

(1) Step for forming a conductive layer pattern by gravure printing using a conductive ink which contains silver nanowires dispersed in a solution containing an organic conductive polymer as a binder
(2) Step for forming a transparent electrode by transferring the conductive layer pattern formed in the previous step on a second substrate.

According to this method, an organic conductive polymer is used for a binder, and thus, the resistance can be maintained at a low level to some extent. However, since a organic conductive polymer having a low shape-holding strength is used as a binder, a printing accuracy is not good, and the long-term reliability is low compared to a metal and an inorganic compound. Therefore, a practical quality as a transparent conductive film cannot be achieved.

Patent Document 8 discloses a method for forming a pattern using a water-soluble polymer such as a cellulose derivative having a Tg in the range of 0 to 250° C. as a binder resin, the method including the following steps.

(1) Step for printing a conductive ink on a substrate, the conductive ink containing silver nanowires dispersed in a solution which contains a water-soluble polymer such as a cellulose derivative having a Tg in the range of 0 to 250° C. as a binder resin.
(2) Step for eluting the water-soluble polymer by subjecting the conductive pattern to a heating and humidifying treatment under a pressurizing condition.

According to this method, no alkaline waste liquid is generated, but waste elution water may be generated. Further, uniformly pressurizing a conductive ink film is difficult, and conductivity is poorly-reproducible.

PRIOR ARTS

Patent Document

Patent Document 1: Japanese Patent No. 4077675
Patent Document 2: Japanese Unexamined Patent Publication (Kohyo) No. 2009-505358
Patent Document 3: Japanese Unexamined Patent Publication (Kokai) No. 2003-100147
Patent Document 4: Japanese Unexamined Patent Publication (Kokai) No. 2012-9383
Patent Document 5: Japanese Unexamined Patent Publication (Kokai) No. 2010-287540
Patent Document 6: Japanese Unexamined Patent Publication (Kokai) No. 2010-165900
Patent Document 7: Japanese Unexamined Patent Publication (Kokai) No. 2010-73322
Patent Document 8: Japanese Unexamined Patent Publication (Kokai) No. 2011-70968

Non-Patent Document

Non-patent Document 1: Shih-Hsiang Lai, Chun-Yao Ou, Chia-Hao Tsai, Bor-Chuan Chuang, Ming-Ying Ma, and Shuo-WeiLiang; SID Symposium Digest of Technical Papers, Vol. 39, Issue 1, pp. 1200-1202 (2008)

SUMMARY

One of the objectives of the present disclosure is to provide a transparent conductive ink which contains metal nanowires and/or metal nanotubes as a conductive component and can form a coating film which has conductivity and a light transmission property, and a transparent conductive pattern forming method wherein this transparent conductive ink is used for forming a transparent conductive pattern by simple production steps, to thereby suppress the production cost and environmental load.

In order to attain the above objective, an embodiment of the present disclosure is a transparent conductive ink which comprises at least one of metal nanowires and metal nanotubes, and a dispersion medium containing a shape-holding material which contains an organic compound having a molecular weight in the range of 150 to 500 and which has a viscosity of $1.0 \times 10^3$ to $2.0 \times 10^6$ mPa·s at 25° C.

The organic compound contained in the shape-holding material is preferably monosaccharides, polyol, a compound having a quaternary carbon atom, or an alkyl group comprising a bridged carbon cyclic structure, and a hydroxyl group. In particular, any one of diglycerine, 2,2,4-trimethyl-1,3-pentanediolmonoisobutyrate, 2,2,4-trimethyl-1,3-pentanediol diisobutyrate, xylulose, ribulose, bornylcyclohexanol, bornylphenol, isobornylcyclohexanol, isobornylphenol, is preferable.

Another embodiment of the present disclosure is a transparent conductive pattern forming method, wherein any selected shape of pattern is printed on a substrate using the above transparent conductive ink, the pattern is subjected to heating treatment for drying the pattern, and the dried pattern is subjected to the pulsed light irradiation.

BRIEF DESCRIPTION OF DRAWINGS

FIG. 3 is a view showing a transparent conductive pattern produced according to an example of the present disclosure.

EMBODIMENT

Figure 1:
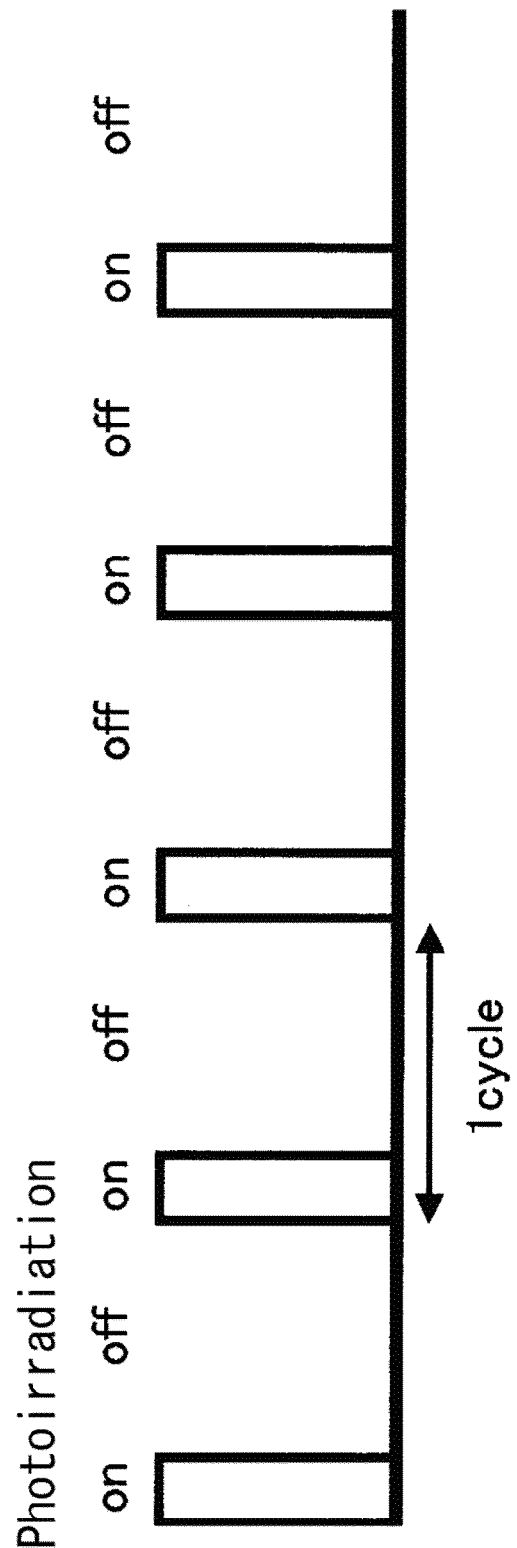
FIG. 1 is a view illustrating the definition of pulsed light.

Hereinbelow, an exemplary embodiment of the present disclosure (hereinafter, referred to as an embodiment) will be described.

A transparent conductive ink according to the embodiment has a dispersion medium containing a below-mentioned shape-holding material, and thereby, metal nanowires and/or metal nanotubes can be preferably dispersed therein. By using this transparent conductive ink, pattern forming by printing can be performed preferably, and by distilling away the dispersion medium, a coating film having both conductivity and a light transmission property can be formed.

The above shape-holding material contains an organic compound having a molecular weight in the range from 150 to 500, and having a viscosity of $1.0 \times 10^3$ to $2.0 \times 10^6$ mPa·s at 25° C. Here, if the organic compound having the viscosity of the above range at 25° C. is liquid, the shape-holding material may be composed only by the organic compound. On the other hand, if the viscosity at 25° C. is higher than the above viscosity range, or the organic compound is solid at 25° C., the organic compound may be previously mixed (diluted, dissolved) with an appropriate solvent (a solvent capable of dissolving the organic compound, such as below-mentioned viscosity adjustment solvent, etc.) to prepare a liquid shape-holding material having a viscosity of the above mentioned range.

If the shape-holding material has a viscosity lower than the above range, the shape of the printed pattern cannot be maintained, whereas if the shape-holding material has a viscosity higher than the above range, bad influences such as thread-forming property may be caused at the time of printing. More preferably, the shape-holding material has a viscosity in the range of $5.0 \times 10^4$ to $1.0 \times 10^6$ mPa·s at 25° C. The viscosity refers to a value measured by using a cone-plate rotational viscometer (cone-plate type).

If the organic compound contained in the shape-holding material to be used has a too large molecular weight, the shape-holding material cannot be efficiently removed at the time of sintering, and thus, the resistance cannot be decreased. Therefore, the molecular weight is 500 or lower, preferably 400 or lower, more preferably 300 or lower.

For such an organic compound, a compound containing a hydroxyl group is preferable, i.e., for example, monosaccharides, polyol, a compound having a quaternary carbon atom and/or an alkyl group comprising a bridged carbon cyclic structure, and a hydroxyl group is preferable, which is, for example, diglycerine, 2,2,4-trimethyl-1,3-pentanediol-monoisobutyrate, 2,2,4-trimethyl-1,3-pentanedioldiisobutyrate, xylulose, ribulose, bornylcyclohexanol bornylphenol, isobornylcyclohexanol, isobornylphenol, etc.

Among the above listed compounds, a compound having an isobornyl group and a hydroxyl group is particularly preferable. The complicated steric structure of the isobornyl group, and the hydrogen bond of the hydroxyl group apply an appropriate viscosity to the ink. Further, a compound having an isobornyl group and a hydroxyl group has a high viscosity although the volatilization temperature is not very high, resulting in providing an ink having a high viscosity. As a compound having an isobornyl group and a hydroxyl group, either one or both of isobornyl cyclohexanol or isobornylphenol may be exemplified. The above listed compounds have an appropriate viscosity, and may apply an appropriate viscosity to the ink. Further, because the compound has an appropriate boiling point as an ink solvent, the residual may be reduced by appropriate heating, photosintering, after the completion of printing and drying. The content of the shape-holding material in the ink is preferably 10 to 90% by mass relative to the total mass of the dispersion medium, and is more preferably 30 to 80% by mass. If the content of the shape-holding material is less than 10% by mass, the ink cannot have an appropriate viscosity, and printing cannot be performed. If the content of the shape-holding material exceeds 90% by mass, the viscosity of the ink is too high, worse thread-forming property may be caused at the time of printing, and printing may not be performed.

It is desired that the shape-holding material itself is a viscous liquid having a viscosity in the above range. However, other viscosity adjustment solvent may be mixed to satisfy the above viscosity range, and to prepare a dispersion medium having a viscosity in the above range, and thereby, the transparent conductive ink may be provided by dispersing metal nanowires and/or metal nanotubes as conductive components in the dispersion medium.

The viscosity adjustment solvent may be, for example, water, alcohol, ketone, ester, ether, aliphatic hydrocarbon solvents and aromatic hydrocarbon solvents. In order that each component can be well dispersed in the ink composition, a preferable viscosity adjustment solvent may be water, ethanol, isopropyl alcohol, 1-methoxy-2-propanol (PGME), ethylene glycol, diethylene glycol, triethylene glycol, dipropylene glycol, ethylene glycol monomethyl ether, ethylene glycol monoethyl ether, ethylene glycol monopropyl ether, diacetone alcohol, ethylene glycol monobutyl ether, propylene glycol, diethylene glycol monomethyl ether, diethylene glycol monoethyl ether, dipropylene glycol monopropyl ether, diethylene glycol monobutyl ether, tripropylene glycol, triethylene glycol monoethyl ether, terpineol, dihydroterpineol, dihydro terpinyl monoacetate, methyl ethyl ketone, cyclohexanone, ethyl lactate, propylene glycol monomethyl ether acetate, diethylene glycol monomethyl ether acetate, diethylene glycol monobutyl ether acetate, ethylene glycol monomethyl ether acetate, ethylene glycol monobutyl ether acetate, dibutyl ether, octane, or toluene, among them, terpineol is particularly preferable. Each solvent may be used by itself, but two or more kinds of the solvents may be mixed.

The metal nanowire and the metal nanotube are metal having a diameter in the order of nanometer, and are conductive materials. The metal nanowire has a wire shape, and the metal nanotube has a porous or nonporous tube shape. In the present specification, both the "wire shape" and the "tube shape" are linear, and the former is not hollow at the center, whereas the latter is hollow at the center. They may be soft or rigid. Either metal nanowires or metal nanotubes may be used, but they may be mixed.

The kind of the metal may be one selected from the group consisting of gold, silver, platinum, copper, nickel, iron, cobalt, zinc, ruthenium, rhodium, palladium, cadmium, osmium, and iridium, or an alloy etc., may by combining from these. In order to obtain a coating film having a low surface resistance and a high total light transmittance, containing at least one of gold, silver, and copper is preferable. These metals have a high conductivity, and thus, when a certain surface resistance should be obtained, the density of the metal within the surface may be reduced, and high total light transmittance can be achieved.

Among these metals, containing at least gold or silver is preferable. The most appropriate example may be the silver nanowire.

The metal nanowires and/or the metal nanotubes in the transparent conductive ink preferably show certain distributions regarding their diameter sizes, major axis lengths, and aspect ratios. The distributions are selected so that the coating film obtained by the transparent conductive ink according to the present embodiment has a high total light transmittance and a low surface resistance. Specifically, the metal nanowires and the metal nanotubes have an average diameter size of preferably 1 to 500 nm, more preferably 5 to 200 nm, still more preferably 5 to 100 nm, and particularly preferably 10 to 100 nm. The metal nanowires and/or the metal nanotubes have an average major axis length of preferably 1 to 100 μm, more preferably 1 to 50 μm, still more preferably 2 to 50 μm, and particularly preferably 5 to 30 μm. While satisfying the above average diameter size and the average major axis length, the metal nanowires and/or the metal nanotube have an average aspect ratio of preferably more than 5, more preferably 10 or more, still more preferably 100 or more, and particularly preferably 200 or more. Here, the aspect ratio refers to a value obtained by a/b, wherein "b" represents an average diameter size of the metal nanowire and/or the metal nanotube and "a" represents an average major axis length thereof. The values "a" and "b" may be measured by a scanning electron microscope.

The production method for the metal nanowire and/or the metal nanotube may be a known production method. For example, silver nanowires may be synthesized by reducing silver nitrate in the presence of polyvinylpyrrolidone, using the Poly-ol method (refer to Chem. Mater., 2002, 14, 4736). Similarly, gold nanowires may be synthesized by reducing gold chloride acid hydrate in the presence of polyvinylpyrrolidone (refer to J. Am. Chem. Soc., 2007, 129, 1733). WO 2008/073143 pamphlet and WO 2008/046058 pamphlet have detailed description regarding the technology of large scale synthesis and purification of silver nanowires and gold nanowires. Gold nanotubes having a porous structure may be synthesized by using silver nanowires as templates, and reducing gold chloride acid solution. The silver nanowires used as templates are dissolved in the solution by oxidation-reduction reaction with the gold chloride acid, and as a result, gold nanotubes having a porous structure can be produced (refer to J. Am. Chem. Soc., 2004, 126, 3892-3901).

With respect to the transparent conductive ink according to the present embodiment, the content of the metal nanowires and/or the metal nanotubes relative to the total mass of the transparent conductive ink is 0.01 to 10% by mass, and more preferably 0.05 to 2% by mass, from the viewpoints of preferable dispersion property of the nanowires, preferable pattern forming property of the coating film obtained by the transparent conductive ink, high conductivity, and a preferable optical property. If the metal nanowires and/or the metal nanotubes are contained less than 0.01% by mass, a very thick transparent conductive film layer should be printed in order to ensure a desired conductivity, and thus, the degree of difficulty in printing increases, and maintaining the pattern during drying becomes difficult. If the content of nanowires/nanotubes exceeds 10% by mass, the printing must be performed very thin in order to ensure a desired transparency, and the printing is also difficult.

The transparent conductive ink according to the present embodiment may contain other component such as a binder resin, a corrosion inhibitor, an adhesive promoter, a surfactant, etc., in accordance with needs, other than the above components (the shape-holding material, the viscosity adjustment solvent, the metal nanowires, the metal nanotubes) as far as the property of the transparent conductive ink is not damaged.

The binder resin may be, for example, a polyacryloyl compound such as polymethyl methacrylate, polyacrylate, polyacrylonitrile, etc.; polyvinyl alcohol; polyester such as polyethylene terephthalate, polyethylene naphthalate, etc.; polycarbonate; high conjugated polymer such as novolak, etc.; imides such as polyimide, polyamideimide, polyetherimide, etc.; polysulfide; polysulfone; polyphenylene; polyphenylether; polyurethane; epoxy; aromatic polyolefin such as polystyrene, polyvinyl toluene, polyvinyl xylene, etc; aliphatic polyolefin such as polypropylene, polymethyl pentane, etc.; alicyclic olefin such as polynorbornene, etc.; polyolefin such as polyvinylpyrrolidone, etc.; acrylonitrile-butadiene-styrene copolymer (ABS); celluloses such as hydroxypropyl methyl cellulose (HPMC), nitrocellulose, etc.; silicone resin; polyacetate; synthetic rubber; chloride-containing polymer such as polyvinyl chloride, chlorinated polyethylene, chlorinated polypropylene, etc.; fluorine-containing polymer such as polyfluoro vinylidene, polytetrafluoroethylene, polyhexafluoropropylene, fluoroolefin-hydrocarbon olefin copolymer.

The corrosion inhibitor may be, for example, benzotriazole, etc. The adhesive promoter may be 2-hydroxy methyl cellulose, etc. The surfactant may be a product having a trade name F-472SF (manufactured by DIC Corporation), etc.

The transparent conductive ink according to the present embodiment can be produced by subjecting the above-mentioned components to appropriately selected treatments such as stirring, mixing, heating, cooling, dissolving, dispersing, and the like, by known methods.

A preferable viscosity of the transparent conductive ink according to the present embodiment may be different depending on the printing methods. In case of screen printing, the viscosity at 25° C. is preferably 100 to $2\times10^5$ mPa·s, and more preferably $10^3$ to $5\times10^4$ mPa·s. The viscosity refers to a value measured by a cone-plate rotational viscometer (cone-plate type).

Using the transparent conductive ink prepared as above, pattern printing is performed by gravure printing, screen printing, inkjet printing, flexo printing, etc.

The substrate for pattern printing may be hard (rigid) or easily bent (flexible), and may be colored. The material for the substrate may be, for example, glass, polyimide, polycarbonate, polyether sulfone, acrylic resin, polyester (polyethylene terephthalate, polyethylene naphthalate, etc.), polyolefin, polyvinyl chloride. These materials may preferably have a high light transmittance and a low haze value. Further, a circuit of TFT elements, etc., or a functional material such as a color filter, etc., may be formed on the substrate. Further, a large number of substrates may be stacked.

The amount of the transparent conductive ink to be coated on the substrate may be determined taking into account the film thickness of the transparent conductive pattern which is obtained depending on the intended use. The film thickness is selected depending on the intended use. A desired film thickness may be obtained by adjusting the coating amount of the transparent conductive ink and conditions for the coating method. The thicker film thickness is preferable from the viewpoint of a low surface resistance, whereas the thinner film thickness is preferable from the viewpoint of suppressing the generation of display defects due to gaps. Taking these into account comprehensively, the film thickness is preferably 5 to 500 nm, more preferably 5 to 200 nm, and still more preferably 5 to 100 nm.

The printed (coated) transparent conductive ink, may be subjected to heating and drying in accordance with needs. The heating temperature may be different depending on the liquid components constituting the dispersion medium, but when the drying temperature is too high, the formed pattern may not be maintained. Therefore, the drying temperature is 120° C. or lower at the highest, and more preferably 100° C. or lower. In particular, the first drying temperature is important. Initiating the drying at about 40 to 80° C., and raising the temperature step by step so as not exceeding 120° C., is particularly preferable. Viscous liquid shape-holding materials generally have high boiling temperatures. If a viscosity adjustment solvent and a shape-holding material are coexistent in a dispersion medium, and the boiling temperature of the viscosity adjustment solvent is lower than the boiling temperature of the shape-holding material, the viscosity adjustment solvent preferentially distilled away. Therefore, the viscosity of the dispersion medium may be increased by drying, leading to suppressing the breakage of the print pattern at the time of drying.

A desired surface resistance and total light transmittance of the obtained transparent conductive pattern may be obtained by adjusting the film thickness, i.e., the coating amount of the composition and the conditions for the coating method, and by adjusting the concentration of the metal nanowire or the metal nanotube in the transparent conductive ink according to the present embodiment.

In general, the thicker the film thickness, the lower the surface resistance and the total light transmittance. Also, the higher the concentration of the metal nanowire or metal nanotube in the transparent conductive ink, the lower the surface resistance and the total light transmittance.

The coating film obtained as above has preferably a surface resistance value of 5 to 1000Ω/□ and a total light transmittance of 80% or more, and more preferably a surface resistance value of 10 to 200Ω/□ and a total light transmittance of 90% or more.

The transparent conductive ink according to the present embodiment may have a to some extent lower surface resistance if the ink is subjected to drying, but in order to efficiently decrease the surface resistance, irradiating a pulsed light is preferable.

In the present specification, the "pulsed light" is a light having a short photo irradiation period (irradiation time). When a plurality of times of photo irradiation are repeated, as shown in FIG. 1, there is a period in which photo irradiation is not performed (irradiation interval (off)) between a first photo irradiation period (on) and a second photo irradiation period (on). In FIG. 1, the pulsed light is illustrated to have a constant light intensity, but the light intensity may vary within one photo irradiation period (on). The pulsed light is irradiated from a light source provided with a flash lamp such as a xenon flash lamp. Using such a light source, pulsed light is irradiated to metal nanowires or metal nanotubes deposited on the substrate. When irradiation is repeated for n-times, one cycle (on+off) in FIG. 1 is repeated for n-times. At the time of repeated irradiation, it is preferable to cool the substrate side so that the substrate can be cooled to a temperature near the room temperature when the next pulsed light irradiation is performed.

For the pulsed light, electromagnetic waves having a wavelength in the range from 1 pm to 1 m may be used, preferably, electromagnetic waves having a wavelength in the range from 10 nm to 1000 μm may be used (from far ultraviolet to far infrared), and more preferably, electromagnetic waves having a wavelength in the range from 100 nm to 2000 nm may be used. Examples of such electromagnetic wave may be gamma rays, X-rays, ultraviolet rays, visible rays, infrared rays, microwaves, radiowaves on the longer wavelength side of the microwaves, and the like. Considering transformation into thermal energy, too short wavelength is not preferable because the shape-holding material and the resin substrate on which the pattern printing is performed, may be largely damaged. Also, too long wavelength is not preferable because efficient absorption and exothermic heating cannot be performed. Accordingly, the wavelength range is preferably the range from the ultraviolet to infrared among the above-mentioned wavelengths, and more preferably, in the range from 100 to 2000 nm.

One irradiation period (on) of the pulsed light is preferably from 20 microseconds to 50 milliseconds, although the period may vary depending on the light intensity. If the period is less than 20 microseconds, sintering of the metal nanowires or the metal nanotubes does not progress, resulting in providing a lower effect of increasing the performance of a conductive pattern. If the period is longer than 50 milliseconds, there may be bad influences on the substrate due to photodegradation and thermal degradation, and further, metal nanowires or metal nanotubes may be easily blown away. More preferably, the irradiation period is from 40 microseconds to 10 milliseconds. Due to the reasons mentioned above, pulsed light instead of continuous light is used in the present embodiment. A single shot of the pulsed light is effective, but the irradiation may be repeated as mentioned above. When the irradiation is repeated, in view of the productivity, the irradiation interval (off) is preferably in the range from 20 microseconds to 5 seconds, and more preferably in the range from 2 milliseconds to 2 seconds. If the irradiation interval is shorter than 20 microseconds, the pulsed light becomes similar to a continuous light and another irradiation is performed after one irradiation without leaving enough time for cooling. Thus, the substrate is heated to a very high temperature and is deteriorated. The irradiation interval longer than 5 seconds is not preferable because the processing time becomes long.

Upon producing a transparent conductive pattern according to the present embodiment, a pattern having a predetermined shape is printed on a substrate using a transparent conductive ink according to the present embodiment, and the printed pattern is subjected to heating and drying. Thereafter, pulsed light having a pulse width (on) in the range of 20 microseconds to 50 milliseconds, and more preferably, in the range of 40 microseconds to 10 milliseconds is irradiated to the pattern using a pulsed xenon irradiation lamp to thereby join the intersections of the metal nanowires or metal nanotubes. Here, joining means that the material (metal) of the nanowires or nanotubes absorbs the irradiated pulsed light at the intersections of the metal nanowires or nanotubes, internal exothermic heat generation occurs more effectively at the intersecting portions, and thus, the intersecting portions are welded. By this joining, the contact area between nanowires or nanotubes at the intersecting portion increases, leading to the decrease of surface resistance. Accordingly, intersections of the metal nanowires or metal nanotubes are joined by the pulsed light irradiation, and thereby, a conductive layer having metal nanowires or metal nanotubes in a network form shape can be formed. Therefore, the conductivity of the transparent conductive pattern can be increased, and surface resistance value becomes 10 to 800Ω/□. With respect to the network formed by the metal nanowires or metal nanotubes, a closely-spaced network is not preferable, because if the space is not enough, the light transmittance may be decreased.

Preferably, a protection film is attached on the upper side of the transparent conductive pattern after the pulsed light irradiation to protect the conductive film.

Instead of irradiating the above-mentioned pulsed light, pressing (pressurizing) the coating film after drying is also effective. Here, the pressing refers to applying pressure to the substrate. The pressing may be performed in any way, but a preferable method may be a method for pressing the substrate by holding the substrate between two flat plates, or a method for applying pressure to the substrate using a cylindrical roll. In particular, the latter method using a roll is preferable because pressure can be applied uniformly.

When pressure is applied by a pressure roll, the linear pressure is preferably 0.1 kgf/cm (98 Pa·m) or more and 1000 kgf/cm (980 kPa·m) or less, and more preferably 1 kgf/cm (980 Pa·m) or more and 100 kgf/cm (98 kPa·m) or less. The feed rate (line speed) of substrate can be properly selected among the practical range. In general, 10 mm/minute or more and 10000 mm/minute or less is preferable, and 10 mm/minute or more and 100 mm/minute or less is more preferable. If the feed rate is too fast, a sufficient pressurizing time may not be obtained, and applying pressure precisely and uniformly may be difficult. Further, maintaining the connection of Ag nanowires by increasing the number of pressure rolls, increasing the number of pressure bonding times, and increasing the pressurizing time, may be an effective method. In order to attach more firmly, heating may be performed during pressing.

When pressuring the substrate while holding the substrate between two flat plates, using a normal pressing device, pressure cannot be applied uniformly, compared to the case using the pressure roll, and thus, the pressure is preferably 0.1 MPa to 200 MPa, and more preferably 1 MPa to 100 MPa.

In order to attach more firmly, heating may be performed during pressing. Due to pressurization, the volume resistivity may be decreased, and in addition, mechanical characteristics such as bending strength, etc., may be increased. With respect to the pressure, the higher the pressure, the more effective to the decrease in the volume resistivity and the increase in the mechanical strength. However, if the pressure is too high, the cost for the pressurization device becomes very high while the effect obtained thereby is not very high. Therefore, the above mentioned upper limit value is preferable.

Either one or both of the above mentioned photoirradiation and pressing may be performed.

EXAMPLES

Hereinafter, specific examples of the present disclosure will be explained. The examples are described below for the purpose of easy understanding of the present disclosure, and the present disclosure is not limited to these examples.

Example 1

(Production of Silver Nanowire)

Figure 2:
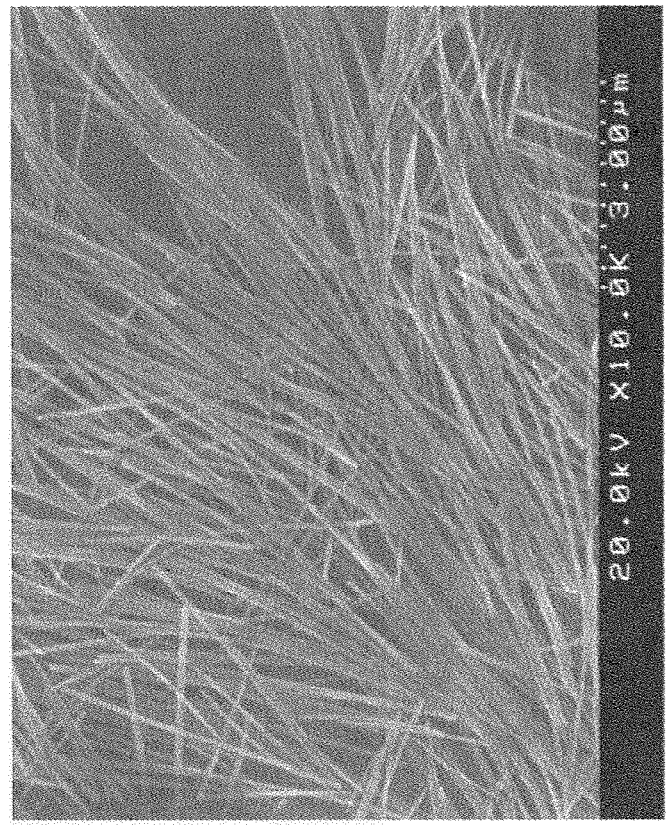
FIG. 2(a) and FIG. 2(b) are views showing SEM images of silver nanowires produced according to an example of the present disclosure.
Figure 2:
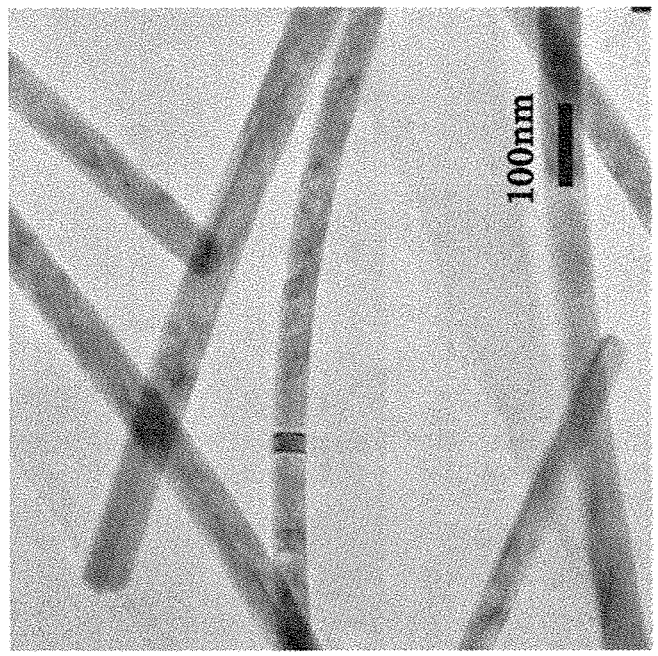

Polyvinylpyrrolidone K-90 (manufactured by Nippon Shokubai Co., Ltd.) (0.049 g), $AgNO_3$ (0.052 g), and $FeCl_3$ (0.04 mg) were dissolved in ethylene glycol (12.5 ml), and were heated and reacted at 150° C. for one hour. The resulting precipitate was isolated by centrifugal separation, and dried to obtain silver nanowires. FIG. 2(a) and FIG. 2(b) show SEM images of the obtained silver nanowire. The SEM used was FE-SEM S-5200 manufactured by Hitachi High-Technologies Corporation.

As can be seen from FIG. 2(a) and FIG. 2(b), the silver nanowire had a rod shape, and the diameter of the rod was about 70 nm, the length thereof was about 10 to 20 μm. 95% or more of the nanowires were grown into the rod shape, and the remaining precipitate was grain-shaped.

The above-mentioned ethylene glycol, $AgNO_3$, and $FeCl_3$ were manufactured by Wako Pure Chemical Industries, Ltd.

The length and the diameter of the silver nanowire were measured by SEM and TEM. The TEM used was manufactured by JEOL Limited, that is, JEOL, JEM-2100 transmission electron microscope.

(Production of Transparent Conductive Ink)

Dibutyl ether was added to the above reaction solution of the silver nanowires heated and reacted at 150° C. for one hour, the volume of the added dibutyl ether being 6 times of the volume of the reaction solution. The mixture was stirred, and thereafter, left to stand, to settle out the nanowires. After the nanowires were settled out, the supernatant liquid was separated by decantation, solvent displacement was performed, and a silver nanowire suspension containing about 20% by mass of silver nanowires dispersed in dibutyl ether was obtained.

L-α-terpineol (manufactured by Nippon Terpene Chemicals Inc.) was added to this silver nanowire suspension, the added the L-α-terpineol having almost the same volume as the suspension, and dispersed well. Then, Tersorb MTPH (isobornyl cyclohexanol, manufactured by Nippon Terpene Chemicals, Inc.) was added as a shape-holding material, and dispersed well using ARV-310 manufactured by Thinky Corporation to thereby obtain transparent conductive ink having a composition described in Table 1.

The ink composition was analyzed by thermogravimetric analysis of the ink, and the residual after the heating at 500° C. was determined as the mass of the silver nanowires. For the thermogravimetric analysis, a differential thermal balance TG-DTA galaxy(S) manufactured by Bruker AXS GmbH was used.

The solvent was calculated by the ratio between the shape-holding material used and the viscosity adjustment solvent. In calculation, the amount of dibutyl ether brought by the silver nanowires was treated as 4 times of the amount of the silver nanowires.

Examples 2 and 3

Transparent conductive inks were prepared in the same way as Example 1, except that the added amounts of dibutyl ether and Tersorb MTPH, and the added amounts and the types of the viscosity adjustment solvent were changed as shown in Table 1, so that the inks had the concentrations as described in Table 1.

Examples 4 to 7, and 9 to 13

Instead of the above-mentioned synthesized silver nanowire, a marketed product SLV-NW-35 (dispersed in isopropanol, concentration 10 mg/ml, silver nanowire having diameter of 35 nm and length of approximately 15 μm (catalog values), manufactured by Blue Nano, Inc.), was used. A small amount of terpineol (manufactured by Nippon Terpene Chemicals Inc.) was added to this silver nanowire dispersion liquid, and dispersed well. Thereafter, isopropanol was distilled away, and solvent displacement was performed. Then, Tersorb MTPH (isobornyl cyclohexanol, manufactured by Nippon Terpene Chemicals, Inc.) and terpineol were added so that final concentrations of the dispersion medium became the mixing ratios (mass ratio) described in Tables 1 to 3, and were dispersed well using ARV-310 manufactured by Thinky Corporation to thereby obtain dispersion liquid. The small amount of terpineol which was added first was predetermined by calculation so that the concentrations of the finally obtained dispersion liquids became the concentrations descried in Tables 1 to 3.

In Tables 1 to 3, NW means nanowire.

Comparative Example 1

The ink was prepared by the composition shown in Table 1, wherein the mixture of polyvinylpyrrolidone (K-90 (manufactured by Nippon Shokubai Co., Ltd.) and diethylene glycol was used as a dispersion medium, and added to the synthesized silver nanowires used in Example 1.

Comparative Example 2

As shown in Table 1, Tersorb MTPH was not used, and only dibutyl ether and L-α-terpineol were used as a dispersion medium, and added to the synthesized silver nanowires used in Example 1, to prepare the ink.

Example 8

The ink was prepared using copper nanowires (isopropanol dispersion liquid, concentration approximately 1 g/900 ml, manufactured by NANOFORGE Corp.) as nanowires. In this dispersion liquid, in order to prevent the aggregation of the copper nanowires, polyvinylpyrrolidone was attached on the wire surfaces, and thus, the below-mentioned purification operations were performed before preparing the ink.

First, 90 ml of dispersion liquid containing 0.1 g of copper was subjected to centrifugal separation, and the supernatant liquid was discarded. Thereafter, N,N-diethylhydroxylamine (manufactured by Tokyo Chemical Industry Co., Ltd., 85% by mass solution was diluted to prepare 3% by mass solution) was used, and dispersion was performed again using a vibrator (VOLTEX3, manufactured by IKA). The operations were repeated for three times. Thereafter, the operation including, performing the centrifugal separation again, discarding the supernatant, adding isopropanol, and performing the dispersion again using the above vibrator, was repeated twice. Thereby, an isopropanol dispersion liquid was obtained.

A small amount of terpineol (manufactured by Nippon Terpene Chemicals Inc.) was added to the obtained copper nanowire dispersion liquid (copper amount 0.1 g) and dispersed well. Thereafter, isopropanol was distilled away, and solvent displacement was performed. Then, Tersorb MTPH (isobornyl cyclohexanol, manufactured by Nippon Terpene Chemicals, Inc.) and terpineol were added so that final concentration of the dispersion medium became terpineol/Tersorb MTPH=1/8 (mass ratio), and were dispersed well using ARV-310 manufactured by Thinky Corporation to thereby obtain dispersion liquid. The small amount of terpineol which was added first was predetermined by calculation so that the concentration of the finally obtained dispersion liquid became 1% by mass shown in Table 1.

(Printing Transparent Conductive Ink)

Examples 1 to 3, Comparative Examples 1 and 2

Using each transparent conductive ink of Examples 1 to 3, 3-cm-square whole surface print and pattern print shown in FIG. 3 were printed by a screen printer MT-320 TVZ (manufactured by Microtek Inc.) (clearance: 1.0 to 1.5 mm, squeegee attack angle: 70°, squeegee speed: 6 mm/sec, squeegee pressure: 0.2 MPa, scraper pressure: 0.15 MPa, back-pressure: 0.1 MPa). For the substrate, a biaxially oriented polyester film: COSMOSHINE (registered trademark) A4300 (thickness 125 μm) manufactured by Toyobo Co., Ltd., was used.

Examples 4 to 13

Using each transparent conductive ink of Examples 4 to 13, a 2.5-cm-square whole surface print was printed by a screen printer MT-320 TVZ (manufactured by Microtek Inc.) (clearance: 1.0 mm, squeegee attack angle: 70°, squeegee speed: 6 mm/sec, squeegee pressure: 0.2 MPa, scraper pressure: 0.15 MPa, back-pressure: 0.1 MPa). For the substrate, a PET film (manufactured by Toray Industries Inc., 125 U98 Easy attachment grade, thickness 125 μm) was used.

After the printing, since pattern keeping is not required for the whole surface print film, the whole surface print film was subjected to drying by a hot air circulation dryer at 120° C. for one hour.

(Viscosity Measurement)

Using a viscometer DV-II+Pro manufactured by Brookfield Engineering Laboratories, the viscosities of the shape-holding material and the transparent conductive ink at 25° C. were measured. When the viscosity exceeded $1.0 \times 10^4$ mPa·s, Rotor No. 52 was used for measurement, and when the viscosity was $1.0 \times 10^4$ mPa·s or lower, Rotor No. 40 was used for measurement.

(Surface Resistance Value Measurement)

Examples 1 to 8, Comparative Example 1

With respect to the silver nanowire deposition layer after the pulsed light irradiation at 600V, 50 μsec (exposure amount 1.14 J/cm$^2$) described in Table 1, the four-point probe surface resistivity/volume resistivity measurement device LORESTA-GP MCP-T610, manufactured by Mitsubishi Chemical Corporation was used for measuring the surface resistance value.

Examples 9 and 10

With respect to the silver nanowire deposition layer after the pulsed light irradiation described in Table 2, the four-point probe surface resistivity/volume resistivity measurement device LORESTA-GP MCP-T610, manufactured by Mitsubishi Chemical Corporation was used for measuring the surface resistance value.

Examples 11 to 13

Using the 10t hydraulic roll press (manufactured by Thank Metal Co., Ltd.) instead of the pulsed light irradiation of Example 4, roll pressing was performed under the conditions shown in Table 3. At the time of roll pressing, for the purpose of coating film protection, a PET film (Lumirror 125T60 surface untreated grade, manufactured by Toray Industries, Inc., thickness 125 μm) was stacked on the deposition layer. Thus, the gap was set to 250 μm by uniformly adding the substrate thicknesses. With respect to the silver nanowire deposition layer after the pressing, the four-point probe surface resistivity/volume resistivity measurement device LORESTA-GP MCP-T610, manufactured by Mitsubishi Chemical Corporation was used for measuring the surface resistance value.

(Light Transmittance Measurement)

Examples 1 to 3, Comparative Example 1

Using a turbidimeter NDH2000 manufactured by Nippon Denshoku Industries Co., Ltd., the total light transmittance was measured. The value in parentheses is a reference value of the light transmittance in the visible light range (400 to 800 nm) measured using a ultraviolet-visible-near infrared spectrophotometer Jasco V-570, manufactured by JASCO Corporation.

Examples 4 to 13

The total light transmittance was measured using a turbidimeter NDH2000 manufactured by Nippon Denshoku Industries Co., Ltd.

TABLE 1

| NW Material | NW Conc. (mass %) | Dibutyl ether (mass %) | Shape-holding material | Conc. in Use (mass %) | Other | Conc. in Use (mass %) | Viscosity adjustment solvent | Conc. in Use (mass %) |
|---|---|---|---|---|---|---|---|---|
| Synthesized AgNW | 2 | 8 | Tersorb MTPH | 63 | none | 0 | L-α-terpineol | 27 |
| Synthesized AgNW | 0.8 | 3.2 | Tersorb MTPH | 87 | none | 0 | diethylene glycol | 9 |
| Synthesized AgNW | 3 | 12 | Tersorb MTPH | 53 | none | 0 | L-α-terpineol | 32 |
| bluenano SLV-NW-35 | 1 | 0 | Tersorb MTPH | 88 | none | 0 | terpineol | 11 |
| bluenano SLV-NW-35 | 0.5 | 0 | Tersorb MTPH | 72 | none | 0 | terpineol | 27 |
| bluenano SLV-NW-35 | 0.33 | 0 | Tersorb MTPH | 80 | none | 0 | terpineol | 20 |
| bluenano SLV-NW-35 | 0.25 | 0 | Tersorb MTPH | 80 | none | 0 | terpineol | 20 |
| Nanoforge CuNW | 1 | 0 | Tersorb MTPH | 88 | none | 0 | terpineol | 11 |
| Synthesized AgNW | 0.5 | 2 | none | 0 | polyvinyl-pyrrolidone | 0.5 | diethylene glycol | 98 |
| Synthesized AgNW | 5 | 20 | none | 0 | none | 0 | L-α-terpineol | 75 |

| NW Material | Viscosity Shape-holding material mPa·s | Viscosity Ink mPa·s | Drying Conditions | Photoirradiation Conditions Voltage V | Photoirradiation Conditions Time μsec | Photoirradiation Conditions Exposure Amount J/cm2 | Surface Resistance (Ω) | Transmittance (%) |
|---|---|---|---|---|---|---|---|---|
| Synthesized AgNW | 640000 | 18000 | 120° C.-1 hr | 600 | 50 | 1.14 | 150 | 78(80) |
| Synthesized AgNW | 640000 | 25000 | 120° C.-1 hr | 600 | 50 | 1.14 | 160 | 79(81) |
| Synthesized AgNW | 640000 | 15000 | 120° C.-1 hr | 600 | 50 | 1.14 | 200 | 77(79) |
| bluenano SLV-NW-35 | 640000 | 14000 | 120° C.-1 hr | 600 | 50 | 1.14 | 6 | 79 |
| bluenano SLV-NW-35 | 640000 | 32000 | 120° C.-1 hr | 600 | 50 | 1.14 | 20 | 86 |
| bluenano SLV-NW-35 | 640000 | 35000 | 120° C.-1 hr | 600 | 50 | 1.14 | 68 | 87 |
| bluenano SLV-NW-35 | 640000 | 35000 | 120° C.-1 hr | 600 | 50 | 1.14 | 285 | 89 |
| Nanoforge CuNW | 640000 | 10000 | 120° C.-1 hr | 600 | 100 | 2.89 | 28 | 78 |
| Synthesized AgNW | | 3000 | 120° C.-1 hr | 600 | 50 | 1.14 | ∞ | 80(82) |
| Synthesized AgNW | | 1500 | Printing Impossible | | | | | |

In Examples 4 to 7, as the silver nanowire concentration was decreased, the surface resistance value gradually increased. At this time, the transmittance increased as the wire concentration decreased.

Comparative Example 1

Although there were no problems regarding the printing property and the pattern keeping property at the time of heating, no conductivity was present even though the photoirradiation or heating at 200° C. was performed.

Comparative Example 2

Similar to Examples, pattern printing and evaluation thereof were tried, but since the viscosity was too low, printing could not be performed.

Example 8

Due to the irradiation at 600V, 100 μsec (exposure amount 2.89 J/cm$^2$), conductivity was present. No conductivity was present by the pulsed light irradiation under the same conditions as Examples 1 to 7. It is assumed that due to the reasons that copper has a higher melting point than silver, the surface of copper may be easily oxidized compared to silver, etc., sintering of copper may be difficult.

TABLE 2

| Examples | NW Material | NW Conc. (mass %) | Shape-holding material | Conc. in Use (mass %) | Other | Conc. in Use (mass %) | Viscosity adjustment solvent | Conc. in Use (mass %) |
|---|---|---|---|---|---|---|---|---|
| 7 | bluenano SLV-NW-35 | 0.25 | Tersorb MTPH | 80 | none | 0 | terpineol | 20 |
| 9 | bluenano SLV-NW-35 | 0.25 | Tersorb MTPH | 80 | none | 0 | terpineol | 20 |
| 10 | bluenano SLV-NW-35 | 0.25 | Tersorb MTPH | 80 | none | 0 | terpineol | 20 |

| | Viscosity | | | Photoirradiation conditions | | | | |
|---|---|---|---|---|---|---|---|---|
| Examples | Shape-holding material mPa·s | Ink mPa·s | Drying Conditions | Voltage V | Time μsec | Exposure amount J/cm2 | Surface Resistance (Ω) | Transmittance (%) |
| 7 | 640000 | 32000 | 120° C.-1 hr | 600 | 50 | 1.14 | 285 | 89 |
| 9 | 640000 | 32000 | 120° C.-1 hr | 600 | 60 | 1.45 | 50 | 89 |
| 10 | 640000 | 32000 | 120° C.-1 hr | 600 | 80 | 2.12 | 50 | 88 |

Examples 7, 9, and 10 show results regarding the influences from the light irradiation conditions (exposure amount). When the intensity of the pulsed light irradiation energy was increased, the surface resistance could be lowered to 50Ω/□, and high transmittance could be maintained.

TABLE 3

| Examples | NW Material | NW Conc. (mass %) | Shape-holding material | Conc. in Use (mass %) | Other | Conc. in Use (mass %) | Viscosity adjustment solvent | Conc. in Use (mass %) |
|---|---|---|---|---|---|---|---|---|
| 11 | bluenano SLV-NW-35 | 1 | Tersorb MTPH | 88 | none | 0 | terpineol | 11 |
| 12 | bluenano SLV-NW-35 | 1 | Tersorb MTPH | 88 | none | 0 | terpineol | 11 |
| 13 | bluenano SLV-NW-35 | 1 | Tersorb MTPH | 88 | none | 0 | terpineol | 11 |

| | Viscosity | | | Press conditions | | Surface | |
|---|---|---|---|---|---|---|---|
| Examples | Shape-holding material mPa·s | Ink mPa·s | Drying Conditions | Gap μm | Pressure t | Resistance (Ω) | Transmittance (%) |
| 11 | 640000 | 14000 | 120° C.-1 hr | 250 | 15 | 10 | 78 |
| 12 | 640000 | 14000 | 120° C.-1 hr | 250 | 12 | 200 | 78 |
| 13 | 640000 | 14000 | 120° C.-1 hr | 250 | 10 | 500 | 78 |

In Examples 1 to 10, the transparent conductive ink was pattern printed, and thereafter, photoirradiation was performed. In Examples 11 to 13, the pattern print was subjected to pressing instead of the photoirradiation. It was confirmed that the conductive ink according to the present disclosure could present conductivity by pressing. Also, as the pressing pressure increases, the conductivity was increased.

(Transparent Conductive Pattern)

Using a screen plate having a pattern shown in FIG. 3, the ink having the composition of Example 1 was printed by a screen printer MT-320 TVZ (manufactured by Microtek Inc.). For the substrate, COSMOSHINE (registered trademark) A4300 (thickness 125 μm) was used. In FIG. 3, the diagonal length of the rhombic pattern P was 2.6 mm, and the gap d between corners of rhombic patterns P in the horizontal direction and the vertical direction in the figure (upper-lower and right-left directions) was 0.4 mm, respectively. The line width of the connection part C which connects the horizontal direction (right-left direction) of the rhombic patterns P was 0.3 mm.

After the printing, the pattern was subjected to drying by a hot air dryer at 50° C. for 30 minutes, and subsequently, subjected to drying at 80° C. for 30 minutes to dry the solvent. At this time, the printed pattern became tack-free, but the resistance thereof was not decreased to show measurable reduction in resistance value.

Next, the pattern after the drying was subjected to pulsed light irradiation. The pulsed light irradiation was performed five times at 600 V-50 μsec using Pulse Forge 3300 manufactured by NovaCentrix. In the present Example, the irradiation interval (off period) was approximately 30 seconds, without taking the productivity into account.

After the pulsed light irradiation, the resistance value between Ia and Ib (electrically connected by the connection part C) in FIG. 3 was measured by a digital multimeter PC500a manufactured by Sanwa Electric Instrument Co., Ltd. As a result, the resistance values were within the range from 5 kΩ to 6 kΩ. Also, the resistance value between Ia and IIb (not electrically connected by the connection part C) in FIG. 3 was measured. As a result, the resistance value could not be measured (resistance was higher than the measurement limit), and it was found that no short-circuit occurred.

The invention claimed is:

1. A transparent conductive ink for pattern printing comprising at least either one of metal nanowires and metal nanotubes, and a dispersion medium which contains a shape-holding material and a viscosity adjustment solvent,
    the shape-holding material containing an organic compound and having a viscosity at 25° C. of $1.0 \times 10^3$ to $2.0 \times 10^6$ mPa·s,
    the organic compound having an alkyl group comprising a bridged carbon cyclic structure, and a hydroxyl group, and having a molecular weight in the range of 150 to 500,
    the viscosity adjustment solvent being at least one of alcohol, ether, and an aliphatic hydrocarbon solvent,
    the content of the metal nanowires or the metal nanotubes relative to the total mass of the transparent conductive ink being 0.01 to 10% by mass,
    the content of the shape-holding material relative to the total mass of the dispersion medium being 10 to 90% by mass, and
    the metal nanowires and the metal nanotubes having an average diameter size of 1 to 500 nm, an average aspect ratio of more than 5, and an average major axis length of 1 to 100 μm.

2. The transparent conductive ink according to claim 1, wherein the organic compound contained in the shape-holding material is bornylcyclohexanol, bornylphenol, isobornylcyclohexanol, or isobornylphenol.

3. The transparent conductive ink according to claim 1, wherein the viscosity adjustment solvent is terpineol.

4. The transparent conductive ink according to claim 1, wherein the content of the metal nanowires or the metal nanotubes is 0.25 to 3% by mass.

5. The transparent conductive ink according to claim 1, wherein the pattern printing is screen printing or gravure printing.

6. The transparent conductive ink according to claim 1, wherein the content of the shape-holding material relative to the total mass of the dispersion medium is 30% by mass or more.

7. The transparent conductive ink according to claim 1, having the viscosity at 25° C. of 100 to $2 \times 10^5$ mPa·s.

8. The transparent conductive ink according to claim 7, having the viscosity at 25° C. of $10^3$ to $5 \times 10^4$ mPa·s.

9. The transparent conductive ink according to claim 1, wherein the metal nanowires and the metal nanotubes have an average aspect ratio of 100 or more.

10. A transparent conductive pattern forming method comprising,
    a step for printing a pattern having an arbitrary shape on a substrate using a transparent conductive ink according to claim 1,
    a step for subjecting the pattern to a heating treatment to dry the pattern, and
    a step for subjecting the pattern which has been dried to pulsed light irradiation or pressing.

* * * * *